US009864536B2

(12) United States Patent
Chun et al.

(10) Patent No.: US 9,864,536 B2
(45) Date of Patent: Jan. 9, 2018

(54) SYSTEM AND METHOD FOR CONSERVING POWER CONSUMPTION IN A MEMORY SYSTEM

(71) Applicant: Qualcomm Incorporated, San Diego, CA (US)

(72) Inventors: Dexter Chun, San Diego, CA (US); Haw-Jing Lo, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 187 days.

(21) Appl. No.: 14/062,859

(22) Filed: Oct. 24, 2013

(65) Prior Publication Data

US 2015/0121096 A1 Apr. 30, 2015

(51) Int. Cl.
*G06F 3/06* (2006.01)
*H03M 7/40* (2006.01)
*H03M 7/30* (2006.01)

(52) U.S. Cl.
CPC .......... *G06F 3/0625* (2013.01); *G06F 3/0644* (2013.01); *G06F 3/0673* (2013.01); *H03M 7/40* (2013.01); *H03M 7/6047* (2013.01)

(58) Field of Classification Search
CPC .... G06F 3/0625; G06F 3/0644; G06F 3/0673; G06F 1/3275; H03M 7/40; H03M 7/6047; H03M 7/3079; H03M 13/235; G11C 11/4074

See application file for complete search history.

(56) References Cited

U.S. PATENT DOCUMENTS

| | | | | |
|---|---|---|---|---|
| 5,003,307 | A | * 3/1991 | Whiting | ................... G06T 9/005 341/106 |
| 5,412,429 | A | * 5/1995 | Glover | ................... H04N 19/61 348/388.1 |
| 5,493,574 | A | 2/1996 | McKinley | |

(Continued)

FOREIGN PATENT DOCUMENTS

| | | |
|---|---|---|
| WO | WO 2011/048400 A1 | 4/2011 |
| WO | WO 2013/095448 A1 | 6/2013 |

OTHER PUBLICATIONS

Benini, Luca, et al. "An adaptive data compression scheme for memory traffic minimization in processor-based systems." Circuits and Systems, 2002. ISCAS 2002. IEEE International Symposium on. vol. 4. IEEE, 2002.*

(Continued)

*Primary Examiner* — Jaweed A Abbaszadeh
*Assistant Examiner* — Brian J Corcoran
(74) *Attorney, Agent, or Firm* — Smith Tempel Blaha LLC

(57) ABSTRACT

Systems and methods are disclosed for conserving power consumption in a memory system. One such system comprises a system on chip (SoC) and an encoder. The SoC comprises one or more memory clients for accessing a dynamic random access memory (DRAM) memory system coupled to the SoC. The encoder resides on the SoC and is configured to reduce a data activity factor of memory data received from the memory clients by encoding the received memory data according to a compression scheme and providing the encoded memory data to the DRAM memory system. The DRAM memory system is configured to decode the encoded memory data according to the compression scheme into the received memory data.

26 Claims, 17 Drawing Sheets

(56) References Cited

U.S. PATENT DOCUMENTS

| | | | |
|---|---|---|---|
| 5,532,694 | A | 7/1996 | Mayers et al. |
| 5,627,533 | A | 5/1997 | Clark |
| 6,032,148 | A * | 2/2000 | Wilkes .............. G06F 17/30315 707/693 |
| 6,081,211 | A * | 6/2000 | de Queiroz et al. ............ 341/65 |
| 6,112,244 | A | 8/2000 | Moore et al. |
| 6,145,069 | A * | 11/2000 | Dye ........................ H03M 7/30 345/501 |
| 6,170,047 | B1 * | 1/2001 | Dye ........................ G06F 12/08 345/531 |
| 6,208,273 | B1 * | 3/2001 | Dye ........................ H03M 7/30 341/51 |
| 6,414,610 | B1 | 7/2002 | Smith |
| 7,095,343 | B2 | 8/2006 | Xie et al. |
| 7,154,416 | B1 * | 12/2006 | Savage ................... H03M 7/30 341/51 |
| 7,190,284 | B1 * | 3/2007 | Dye ...................... G06F 12/023 341/51 |
| 7,386,046 | B2 * | 6/2008 | Fallon ..................... H03M 7/30 375/240 |
| 7,587,458 | B2 | 9/2009 | Wong |
| 7,961,640 | B2 | 6/2011 | Prakash et al. |
| 8,001,294 | B2 | 8/2011 | Inoue et al. |
| 8,301,686 | B1 | 10/2012 | Appajodu et al. |
| 8,787,442 | B2 * | 7/2014 | Park et al. ..................... 375/240 |
| 9,143,546 | B2 * | 9/2015 | Fallon ................ H04L 12/1895 |
| 2002/0059462 | A1 | 5/2002 | Hannu et al. |
| 2002/0115407 | A1 | 8/2002 | Thompson et al. |
| 2004/0041813 | A1 | 3/2004 | Kim |
| 2005/0185677 | A1 | 8/2005 | Christoffersson et al. |
| 2011/0145313 | A1 | 6/2011 | Narayanan et al. |
| 2012/0260009 | A1 * | 10/2012 | Lu et al. ........................ 710/52 |
| 2012/0268298 | A1 * | 10/2012 | Oh .................................. 341/87 |
| 2012/0296983 | A1 | 11/2012 | Boehm |
| 2015/0121111 | A1 | 4/2015 | Chun et al. |

OTHER PUBLICATIONS

Lekatsas, Haris, Jörg Henkel, and Wayne Wolf. "Code compression for low power embedded system design." Proceedings of the 37th Annual Design Automation Conference. ACM, 2000.*

Kemp, Timothy M., et al. "A decompression core for PowerPC." IBM Journal of Research and Development 42.6 (1998): 807-812.*

C. y. Chen, Y. t. Pai and S. j. Ruan, "Low Power Huffman Coding for High Performance Data Transmission," 2006 International Conference on Hybrid Information Technology, Cheju Island, 2006, pp. 71-77.*

Mehrdad Nourani and Mohammad H. Tehranipour. 2005. "RL-huffman encoding for test compression and power reduction in scan applications." ACM Trans. Des. Autom. Electron. Syst. 10, 1 (Jan. 2005), 91-115. ("Nourani").*

Nikara, J., S. Vassiliadis, J. Takala, and P. Liuha. "Multiple-symbol Parallel Decoding for Variable Length Codes." IEEE Transactions on Very Large Scale Integration (VLSI) Systems 12.7 (2004): 676-85. Web. Mar. 3, 2017.*

Choudhury, Mihir, Kyle Ringgenberg, Scott Rixner, and Kartik Mohanram. "Single-ended Coding Techniques for Off-chip Interconnects to Commodity Memory." 2007 Design, Automation & Test in Europe Conference & Exhibition (2007): n. pag. Web. Mar. 3, 2017.*

International Search Report and Written Opinion—PCT/US2014/061921—ISA/EPO—dated Feb. 23, 2015.

Riemens A K, et al., "Transparent Embedded Compression in Systems-on-Chip", internet article, 2006, XP002735948, Retrieved from the internet: URL: http:www.riemens.org/bram/sips2006_emb_cmprs.pdf [retrieved on Feb. 13, 2015] the whole document.

Salomon D: "Data compression, the complete reference, Huffman Coding", Jan. 1, 2007 (Jan. 1, 2007). Data Compression The Complete Reference, Springer Verlag, Londen, GB, pp. 74-81, XP002653994, ISBN: 978-1-84628-602-5 the whole document table 2.17 figure 2. 16 figure 2.18.

* cited by examiner

SYSTEM AND METHOD FOR CONSERVING POWER CONSUMPTION IN A MEMORY SYSTEM

RELATED APPLICATIONS STATEMENT

This Application is related to co-pending U.S. patent application Ser. No. 14/062,866, entitled, "SYSTEM AND METHOD FOR PROVIDING MULTI-USER POWER SAVING CODEBOOK OPTIMIZATION," filed on Oct. 24, 2013.

DESCRIPTION OF THE RELATED ART

Dynamic random access memory (DRAM) is used in various computing devices (e.g., personal computers, laptops, notebooks, video game consoles, portable computing devices, mobile phones, etc.). DRAM is a type of volatile memory that stores each bit of data in a separate capacitor within an integrated circuit. The capacitor can be either charged or discharged. These two states are taken to represent the two values of a bit, conventionally called 0 and 1. Because capacitors leak charge, the information eventually fades unless the capacitor charge is refreshed periodically. Because of this refresh requirement, DRAM is referred to as a dynamic memory as opposed to SRAM and other static memory.

An advantage of DRAM is its structural simplicity—only one transistor and a capacitor are required per bit—which allows DRAM to reach very high densities. However, as DRAM density and speed requirements continue to increase, memory power consumption is becoming a significant problem.

Power within DRAM is generally categorized as core memory array power and non-core power. Core memory array power refers to power for retaining all the data in the bitcells/arrays and managing leakage and refresh operations. Non-core power refers to power for transferring all the data into and out of the memory device(s), sensing amps, and managing peripheral logic, multiplexers, internal busses, buffers, input/output (I/O) drivers, and receivers. Reducing non-core power is a significant problem.

Existing solutions to reduce non-core power have typically involved reducing operating voltages, reducing load capacitances, or temporarily reducing the frequency of operation whenever performance is not required. These solutions, however, fail to address demanding bandwidth intensive use cases. Other solutions have attempted to reduce the data activity factor associated with the memory system. The data activity factor, k, refers to the number of 0-to-1 toggles or transitions in the memory access system over a fixed period. For example, in the following 8-beat sequence over a single wire, 0,1,0,1,0,1,0,1, k=0.5. Attempts at reducing the data activity factor have been proposed for specific types of data, such as, display frame buffers using image compression. This is typically performed at the source (i.e., the display hardware engine). Such solutions, however, are very specialized and limited to this type of display data, which typically accounts for a relatively small percentage of total DRAM usage. Accordingly, there remains a need in the art for improved systems and methods for conserving power consumption in DRAM memory systems.

SUMMARY OF THE DISCLOSURE

Systems and methods are disclosed for conserving power consumption in a memory system. One embodiment is a method for conserving power consumption in a memory system. One such method comprises: receiving memory data from one or more memory clients residing on a system on chip (SoC) for accessing a dynamic random access memory (DRAM) memory system coupled to the SoC; reducing a data activity factor defined by the received memory data by encoding the received memory data according to a compression scheme; providing the encoded memory data to the DRAM memory system; and the DRAM memory system decoding the encoded memory data according to the compression scheme into the received memory data.

Another embodiment is a system for conserving power consumption in a memory system. One such system includes a system on chip (SoC) comprising one or more memory clients for accessing a dynamic random access memory (DRAM) memory system coupled to the SoC. The SoC further comprises an encoder configured to reduce a data activity factor of memory data received from the memory clients by encoding the received memory data according to a compression scheme and providing the encoded memory data to the DRAM memory system. The DRAM memory system is configured to decode the encoded memory data according to the compression scheme into the received memory data.

BRIEF DESCRIPTION OF THE DRAWINGS

In the Figures, like reference numerals refer to like parts throughout the various views unless otherwise indicated. For reference numerals with letter character designations such as "102A" or "102B", the letter character designations may differentiate two like parts or elements present in the same Figure. Letter character designations for reference numerals may be omitted when it is intended that a reference numeral to encompass all parts having the same reference numeral in all Figures.

DETAILED DESCRIPTION

The word "exemplary" is used herein to mean "serving as an example, instance, or illustration." Any aspect described herein as "exemplary" is not necessarily to be construed as preferred or advantageous over other aspects.

In this description, the term "application" may also include files having executable content, such as: object code, scripts, byte code, markup language files, and patches. In addition, an "application" referred to herein, may also include files that are not executable in nature, such as documents that may need to be opened or other data files that need to be accessed.

The term "content" may also include files having executable content, such as: object code, scripts, byte code, markup language files, and patches. In addition, "content" referred to herein, may also include files that are not executable in nature, such as documents that may need to be opened or other data files that need to be accessed.

As used in this description, the terms "component," "database," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

In this description, the terms "communication device," "wireless device," "wireless telephone", "wireless communication device," and "wireless handset" are used interchangeably. With the advent of third generation ("3G") wireless technology and four generation ("4G"), greater bandwidth availability has enabled more portable computing devices with a greater variety of wireless capabilities. Therefore, a portable computing device may include a cellular telephone, a pager, a PDA, a smartphone, a navigation device, or a hand-held computer with a wireless connection or link.

Figure 1:
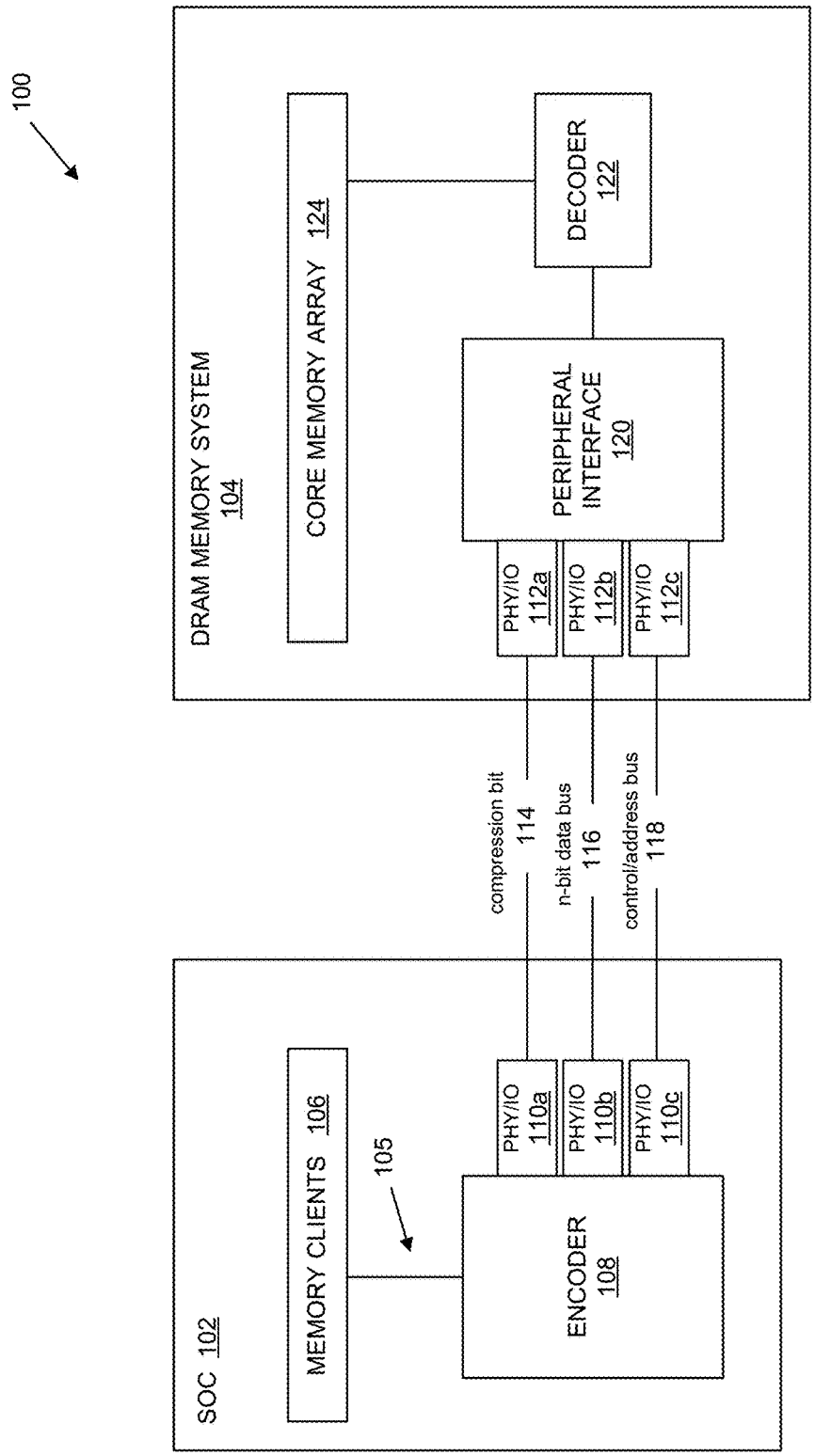
FIG. 1 is a block diagram of an embodiment of system for conserving power consumption in a DRAM memory system coupled to a SoC.

FIG. 1 illustrates a system 100 for conserving power consumption in a DRAM memory system 104. The system 100 may be implemented in any computing device, including a personal computer, a workstation, a server, a portable computing device (PCD), such as a cellular telephone, a portable digital assistant (PDA), a portable game console, a palmtop computer, or a tablet computer. As illustrated in the embodiment of FIG. 1, the system 100 comprises a system on chip (SoC) 102 coupled to a DRAM memory system 104. The SoC 102 comprises various on-chip components, including one or more memory clients 106 that request memory resources from DRAM memory system 104. The memory clients 106 may comprise one or more processing units (e.g., central processing unit (CPU), graphics processing unit (GPU), digital signal processor (DSP), display processor, etc.), a video encoder, or other clients requesting read/write access to DRAM memory system 104. The memory clients 106 are connected to an encoder 108 via a SoC bus 105.

As described below in more detail, the encoder 108 is configured to reduce power consumption of the DRAM memory system 104 by reducing a data activity factor, k, of the data input to DRAM memory system 104. Power within the DRAM memory system 104 may be categorized as core memory array power and non-core power. As known in the art, core memory array power refers to power for retaining all the data in the core memory array 124 and managing leakage and refresh operations. Non-core power refers to power for transferring all the data into and out of the memory device(s), sensing amps, and managing peripheral logic, multiplexers, internal busses, buffers, input/output (I/O) drivers, and receivers. The encoder 108 reduces non-core power by reducing the data activity factor of the memory data input via, for example, entropy-based compression.

Dynamic or non-core power in the DRAM memory system 104 may be represented by Equation 1:

$$\text{Dynamic Power} = kCV^2 f * \text{density, wherein} \qquad \text{Equation 1}$$

k=data activity factor
C=load capacitance
V=voltage
f=frequency or toggling rate
density=total capacity in gigabytes (GB)

The data activity factor, k, may be defined as a number of 0-to-1 toggles or transitions over a fixed period. For example, in a 1-bit 8-beat sequence, 01010101, k=0.5. The smallest access to the DRAM memory system 104 is referred to as one DRAM minimum access length (MAL) transaction. For a 32-bit parallel LPDDR3 DRAM bus, MAL=32 bits*8 beats=256 bits=32 bytes (eight beats, 32-bits wide). MAL transactions may occur continuously, back-to-back.

Because density and frequency demands are increasing, reducing non-core power requires: reducing load capacitance, reducing voltage, minimizing k for each bit from beat to beat, or minimizing k for each bit from MAL to MAL. Existing methods to reduce non-core power have generally involved reducing the operating voltages, reducing the load capacitances, or temporarily reducing the frequency of operation whenever performance is not required (which fails to address demanding bandwidth intensive use cases). Attempts at reducing the data activity factor, k, have been proposed for specific types of data, such as, display frame buffers using image compression. However, this is typically performed at the source (e.g., the display hardware engine). Such solutions, however, are very specialized and limited to this type of display data, which typically accounts for a relatively small percentage of total DRAM usage.

The system 100 of FIG. 1 may conserve or optimize non-core power consumption of the entire DRAM memory system 104 by reducing the data activity factor, k, of memory data input for all memory clients 106. The SoC 102 and DRAM memory system 104 communicate via one or more connections, interfaces, or buses. In the embodiment of FIG. 1, the SoC 102 comprises physical layer or input/output devices (PHY/IO) 110a, 110b, and 110c. The DRAM memory system 104 comprises PHY/IO 112a, 112b, and 112c. PHY/IO 110a and PHY/IO 112a are coupled via a connection 114, which may comprise a channel for communicating a metadata compression bit (referred to as a "c-bit") to indicate if the data has been compressed or not. PHY/IO 110b and PHY/IO 112b are coupled via a connection 116, which may comprise an n-bit data bus. PHY/IO 110c and PHY/IO 112c are coupled via a connection 118, which may comprise a control/address bus.

In operation, memory data from the memory clients 106 within the SoC 102 passes through the encoder 108. The encoder 108 may compress the memory data via, for example, a simplified Huffman scheme to compress and zero pad the data, which is then provided to the DRAM memory system 104 via connections 114 and 116. The DRAM memory system 104 receives the data into PHY/IO devices 112a, 112b, and/or 112c. Peripheral interface 120 provides the compressed data to the decoder 122, which is configured to reverse transform the data back into the original uncompressed form and then stored to the core memory array 124. It should be appreciated that the DRAM memory system 104 may comprise any number of DRAM memory devices of any desirable types, sizes, and configurations of memory.

Figure 2:
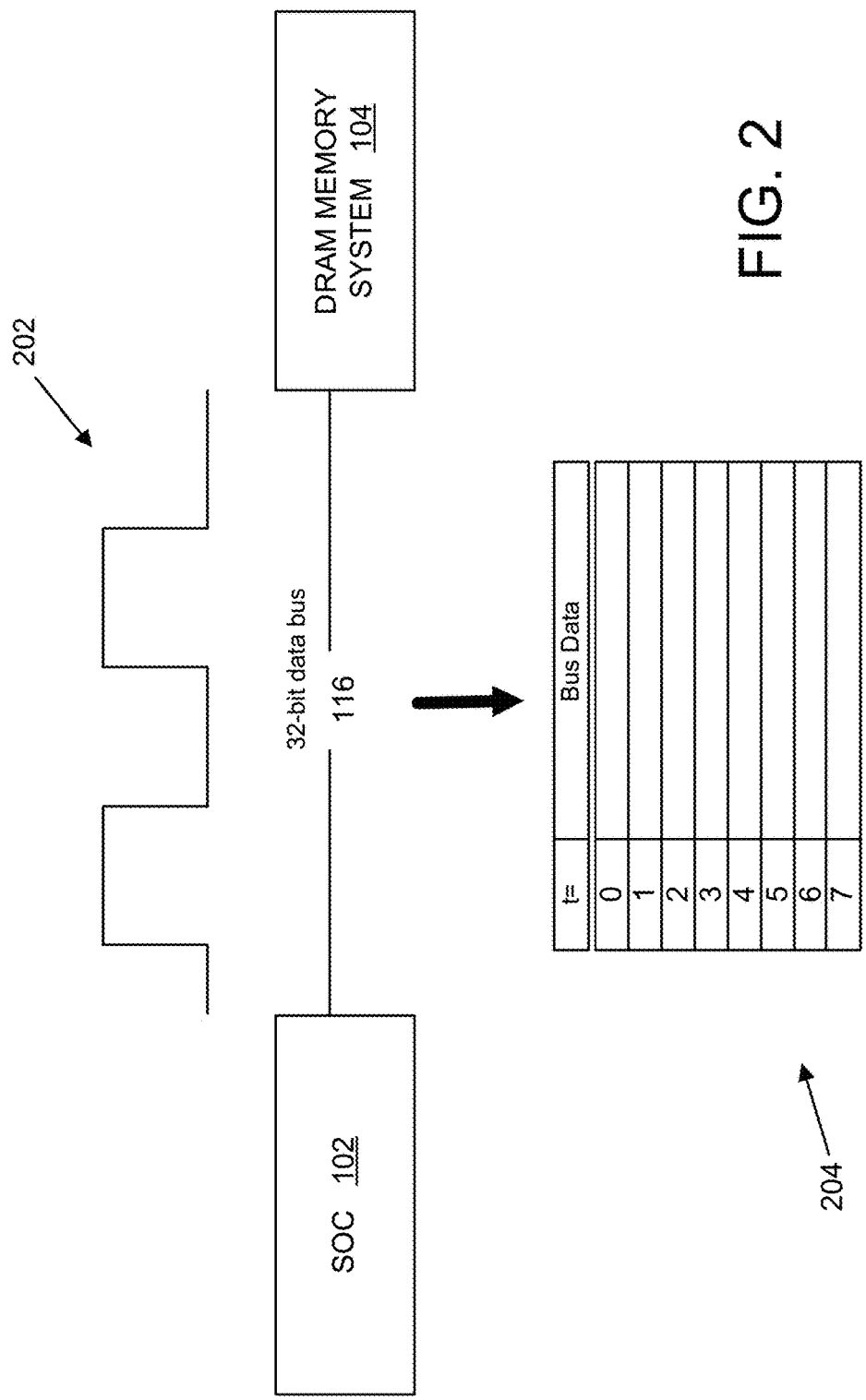
FIG. 2 is a diagram illustrating an exemplary embodiment of the data bus coupling the SoC and the DRAM memory system of FIG. 1.
Figure 3:
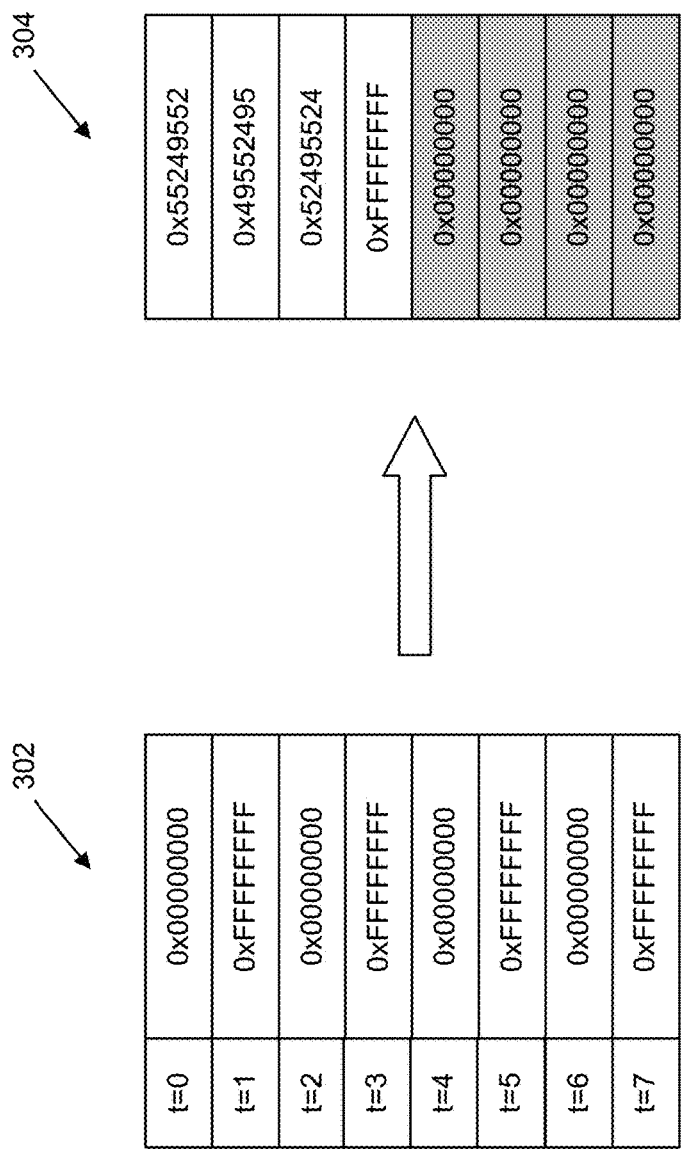
FIG. 3 is data diagram illustrating uncompressed data input to and compressed data output from the encoder of FIG. 1 for an exemplary minimum access length (MAL) transaction defined by the DRAM memory system.

FIG. 2 illustrates an exemplary 32-bit parallel LPDDR3 DRAM bus 116 between the SoC 102 and the DRAM memory system 104. In this embodiment, used for exemplary purposes, the MAL transaction 204 comprises 32 bits for 8 beats (i.e., t=0, 1, 2, 3, 4, 5, 6, 7) of the clock 202. Each MAL=32 bits*8 beats=256 bits=32 bytes. The encoder 108 reduces the data activity factor, k, by compressing each MAL transaction 204. FIG. 3 illustrates an exemplary encoding example for MAL transaction 204. The uncompressed data 302 may be processed via, for example, entropy-based compression to produce compressed data 304. Uncompressed data 302 may comprise, for example, 32 bytes of raw uncompressed data. The compression algorithm embodied in the encoder 108 may compress the uncompressed data 302 into, for example, 16 bytes followed by zero padding represented by the greyed-out beats (i.e., t=4, 5, 6, 7), thereby reducing the data activity factor, K, associated with MAL transaction 204.

Figure 4:
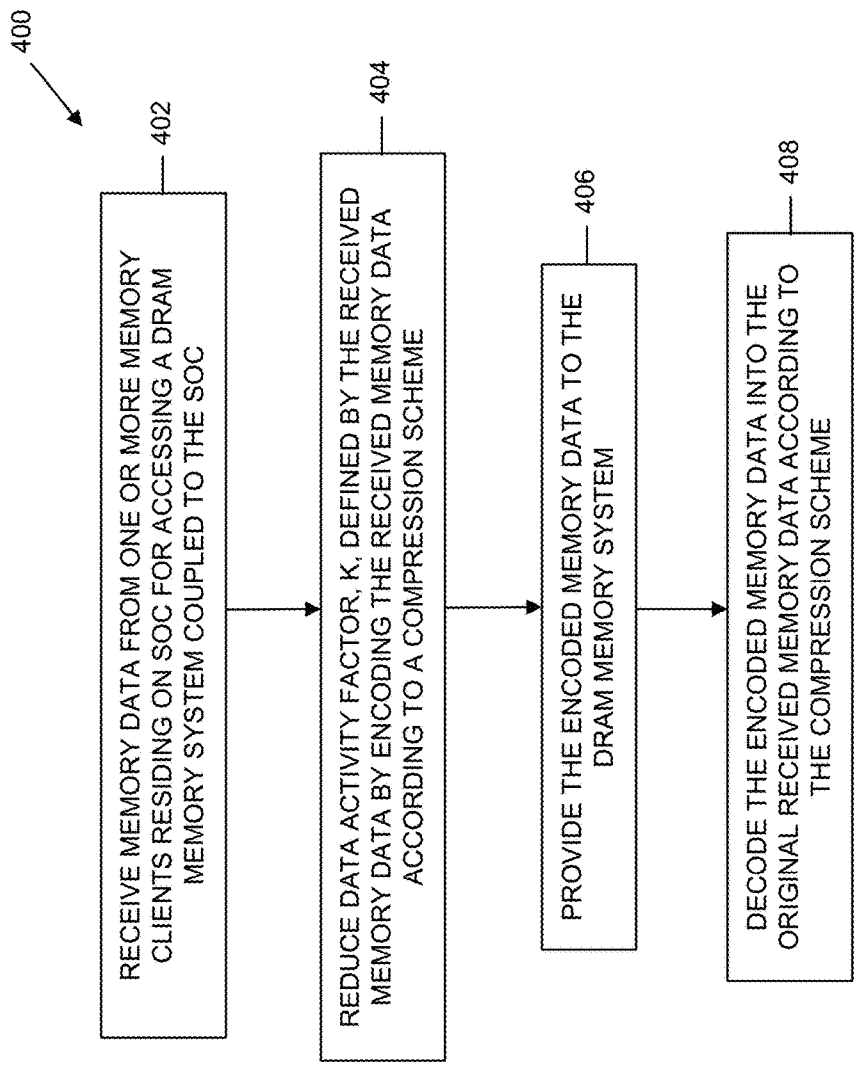
FIG. 4 is a flow chart illustrating an embodiment of a method implemented in the system of FIG. 1 for conserving power consumption.

FIG. 4 illustrates a method 400 implemented by the system 100 of FIG. 1 for reducing non-core power of the DRAM memory system 104. At block 402, the encoder 108 receives memory data from one or more memory clients 106 residing on the SoC 102 for accessing the DRAM memory system 104. At block 404, the encoder 108 reduces the data activity factor, k, defined by the received memory data by encoding the received memory data according to a compression scheme. In an embodiment, the data activity factor, k, is reduced on a MAL-by-MAL basis. It should be appreciated that various embodiments of compression schemes may be implemented. In one embodiment, the compression scheme comprises entropy-based compression via, for example, a simplified Huffman scheme with zero padding. At block 406, the encoded or compressed memory data is provided to the DRAM memory system 104. As described below in more detail, the encoder 108 may comprise logic for evaluating the effectiveness of the compression algorithm for each MAL. In this manner, the encoder 108 may generate a compression or C-bit to identify whether the data has been compressed or not. At block 408, a decoder 122 in the DRAM memory system 104 may decode the encoded memory data into the original received memory data according to the compression scheme. In this manner, the non-core power of the DRAM memory system 104 may be selectively reduced to accommodate lower power use cases.

Figure 5:
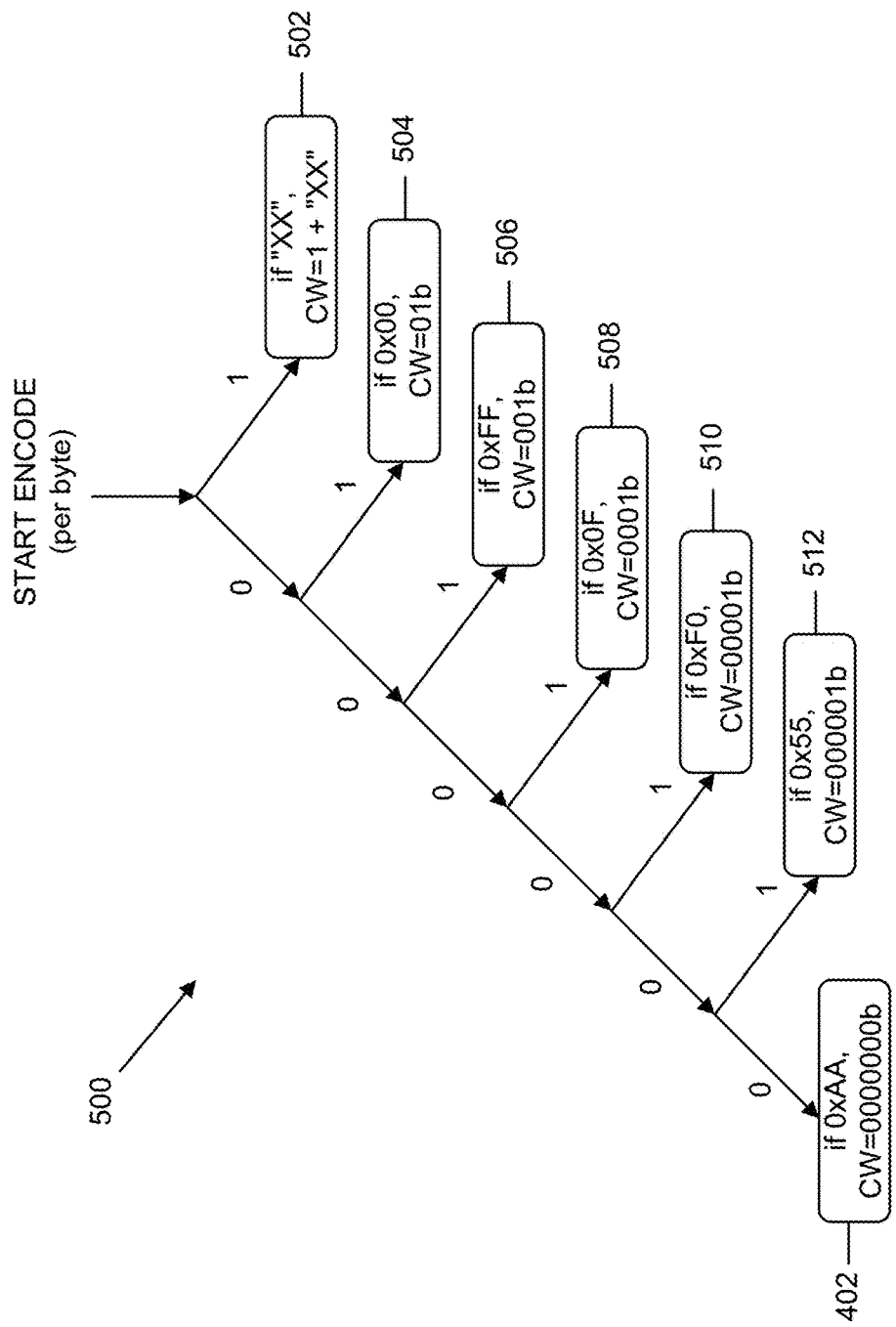
FIG. 5 is a simplified Huffman tree for implementing an embodiment of a compression algorithm for reducing the data activity factor of the system of FIG. 1.

FIG. 5 illustrates an embodiment of an entropy-based encoding algorithm that may be implemented by the encoder 108. A Huffman encoding scheme may comprise a code table for encoding a source symbol. The code table may comprise a predetermined number of source symbols based on an estimated probability of occurrence. A simplified Huffman tree 500 may embody the most frequent symbols or "patterns" to be compressed. In an embodiment, the algorithm operates on a per byte basis. Byte compression occurs if the source symbol or pattern associated with the memory data (e.g., MAL beat(s)) matches any of the "leafs" on the left half of the Huffman tree 500. It should be appreciated that, in the figures, a prefix "0x" signifies that hexadecimal (hex) digits follow, while a suffix of "b" signifies that binary digits (bits) precede. Block 504 represents the pattern "00" hex being matched to a code word (CW=01b). Block 506 represents the pattern "FF" hex being matched to a code word (CW=001b). Block 508 represents the pattern "0F" hex being matched to a code word (CW=0001b). Block 510 represents the pattern "F0" hex being matched to a code word (CW=00001b). Block 512 represents the pattern "55" hex being matched to a code word (CW=000001b). Block 514 represents the pattern "AA" hex being matched to a code word (CW=000000b). It should be appreciated that the patterns may be programmed. As further illustrated in FIG. 5, if there is not a match, the right half of the Huffman tree may incur an extra bit penalty per byte. For example, block 502 illustrates that a pattern "XX" may incur a bit penalty and be encoded with a code word (CW=1b+0x"XX") resulting in a codeword length of 9-bits.

Figure 6:
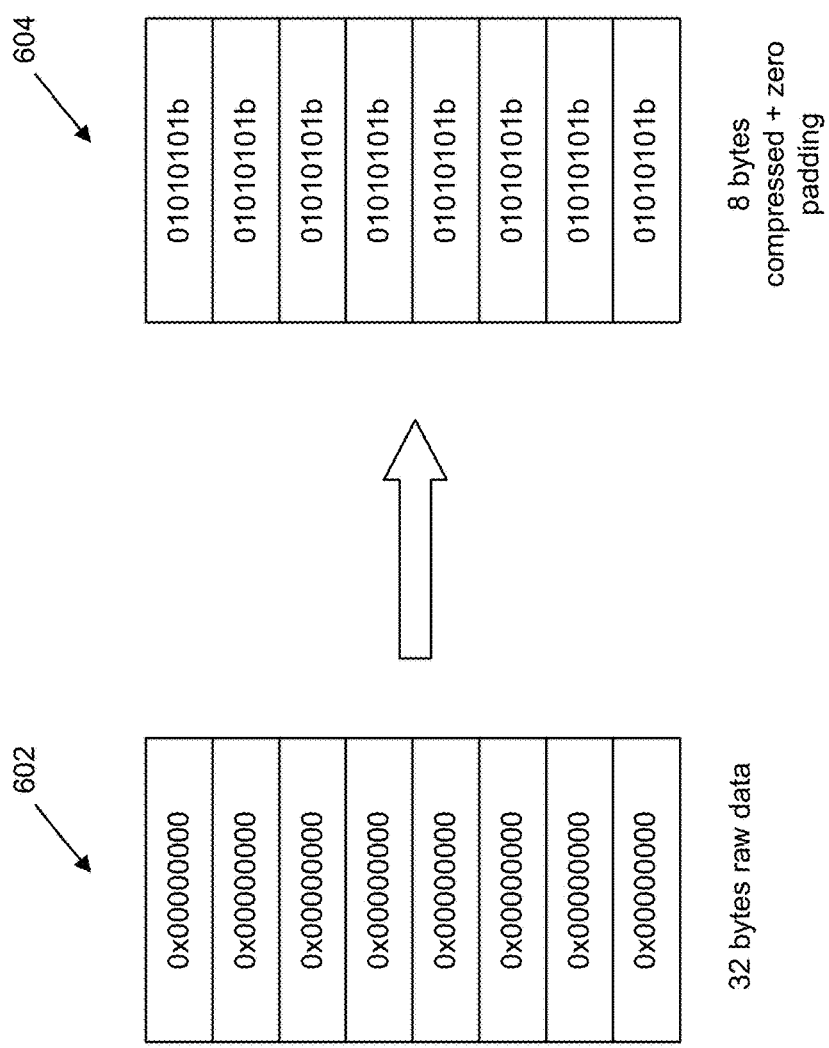
FIG. 6 illustrates a first compression use case for an exemplary MAL transaction for the DRAM memory system of FIG. 1.

FIG. 6 illustrates an example of a first compression use case for a MAL transaction compressed using the Huffman tree 500. The uncompressed MAL 602 comprises 32 bytes of raw data. Each of the 8 beats comprises the source pattern "00" hex, which may be encoded with the code word (CW=01b). In this "best case" example, the resulting compressed MAL 604 comprises 8 bytes compressed followed by zero padding. In the example of FIG. 6, each of the rows in the uncompressed MAL 602 represent the source pattern "00". Each row in the uncompressed MAL 602 is encoded with the corresponding codeword (CW=01b). The compressed MAL 604 illustrates the results of the encoding for each row in the uncompressed MAL 602.

Figure 7:
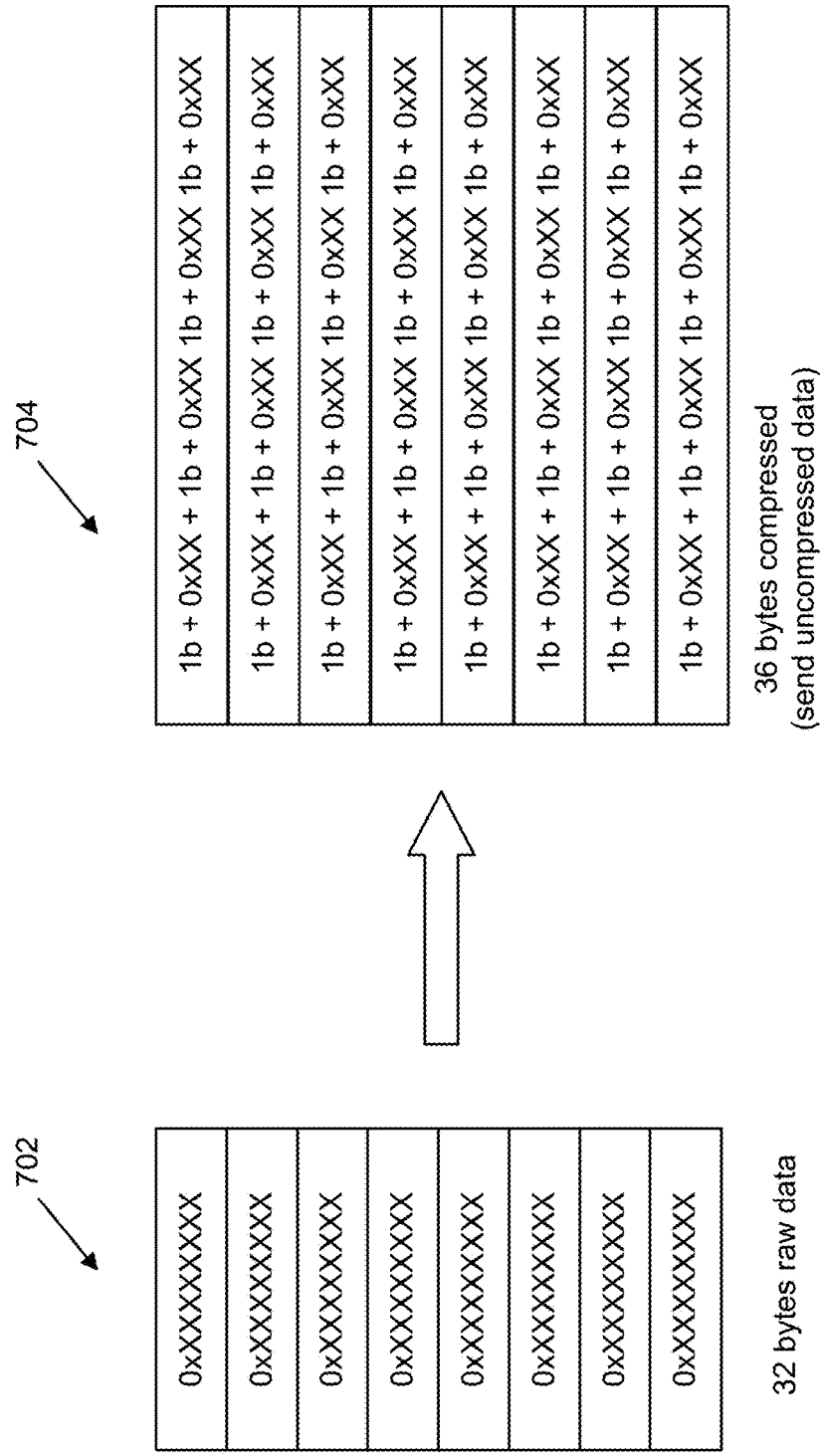
FIG. 7 illustrates a second compression use case for an exemplary MAL transaction for the DRAM memory system of FIG. 1.

FIG. 7 illustrates a "worst case" example in which each beat of the uncompressed MAL 702 comprises the source pattern "XX" hex, which is not compressed and incurs an extra bit penalty per byte. The resulting compressed MAL 704 comprises 36 bytes. In the example of FIG. 7, each of the rows in the uncompressed MAL 702 represent a source pattern "XX". The compressed MAL 704 illustrates the results of the encoding for each row in the uncompressed MAL 702. In other words, each source pattern "XX" is encoded with the codeword (CW=1b+0xXX). In this example, where compression results in a larger size, the encoder 108 may send the uncompressed data 702 instead of the compressed data 704. In this regard, it should be appreciated that the encoder 108 may generate an extra compression or C-bit to define whether the data was compressed or not.

In some embodiments, the C-bit may be separately transmitted (e.g., via interface 114—FIG. 1) and stored into a separate memory device in DRAM memory system 104. In other embodiments, the C-bit may be concatenated with the data transmitted on the data bus (e.g., interface 116—FIG. 1) and stored into the same DRAM chip. It should be further appreciated that the C-bit may be used only for the interface without having to store it in the DRAM memory system 104. If the C-bit is not stored in DRAM memory, in an embodiment, a decoder 122 may be incorporated in each memory as shown in FIG. 1. If the C-bit is stored in DRAM memory, it should be appreciated that, in an embodiment, additional DRAM space may be used to store, for example, 1 C-bit for each 32 bytes of data, and the decoder 122 may be located in the SoC 102 rather than the DRAM memory system 104.

The system 100 may be enhanced with logic for analyzing the effectiveness of the compression coefficient set (i.e., C-bit) statistics using, for example, an optimization program running on a client within the system 100 or external component(s), such as, for example, a cloud-based server. In an embodiment, the encoder 108 may comprise counters that keep track of the compression statistics and make improvements across a large number of end users. The encoder 108 may be configured with the capability to turn off compression for specific clients 106.

In an embodiment, the DRAM memory system 104 may be used by all the memory clients 106 on the SoC 102. In this manner, the encoder 108 is in the path of all of the traffic from all of the memory clients 106. There may be instances when it may not be desirable to encode the data from certain clients 106. For example, if the display processor is already compressing DRAM data, then having the encoder 108 re-attempt compression would be a waste of power. Therefore, the encoder 108 will have a separate enable bit and also will collect the C-bit statistics for each client 106. Each memory client 106 during every DRAM transaction may include a master ID (MID) that uniquely identifies that client. For each memory client 106, when it is enabled for compression, the encoder 108 may attempt to compress and it may count the total number of transactions and the number of uncompressed transactions. These counters/statistics may be available to the CPU. The default may be to always enable compression for all memory clients 106

To disable compression, the CPU may clear the enable bit for a particular memory client 106, and from then on, any writes to the DRAM memory system 104 may bypass the encoder 108, but the C-bit may still be transmitted as zero, which means that the data is uncompressed. Any reads from the DRAM memory system 104 may contain either compressed or uncompressed data and the C-bit may correctly indicate whether decompression is required or not. For example, decompression of the read data may still occur even after the CPU has cleared the compression enable bit for a particular memory client 106.

Figure 11:
FIG. 11 is an embodiment of a table for tracking compression statistics for the system of FIG. 1.

FIG. 11 illustrates an exemplary table 1100 that may be accessible by the CPU. Table 1100 comprises a client name field 1102, a master ID (MID) field 1104, a compression enable bit field 1106, a total number of transactions field 1108, and a total number of uncompressed transactions field 1109. Each memory client 106 has a unique MID. The CPU can enable or disable compression for each client. When enabled, the encoder 108 may keep an updated tally of the compression statistics for each client, which may independently enable or disable compression based on the "compressibility" of the traffic for each respective client. For example, in an embodiment, if a particular client has sufficient incompressible traffic (C-bit=0) that exceeds a programmable threshold, the compression for that client may be disabled.

Figure 8:
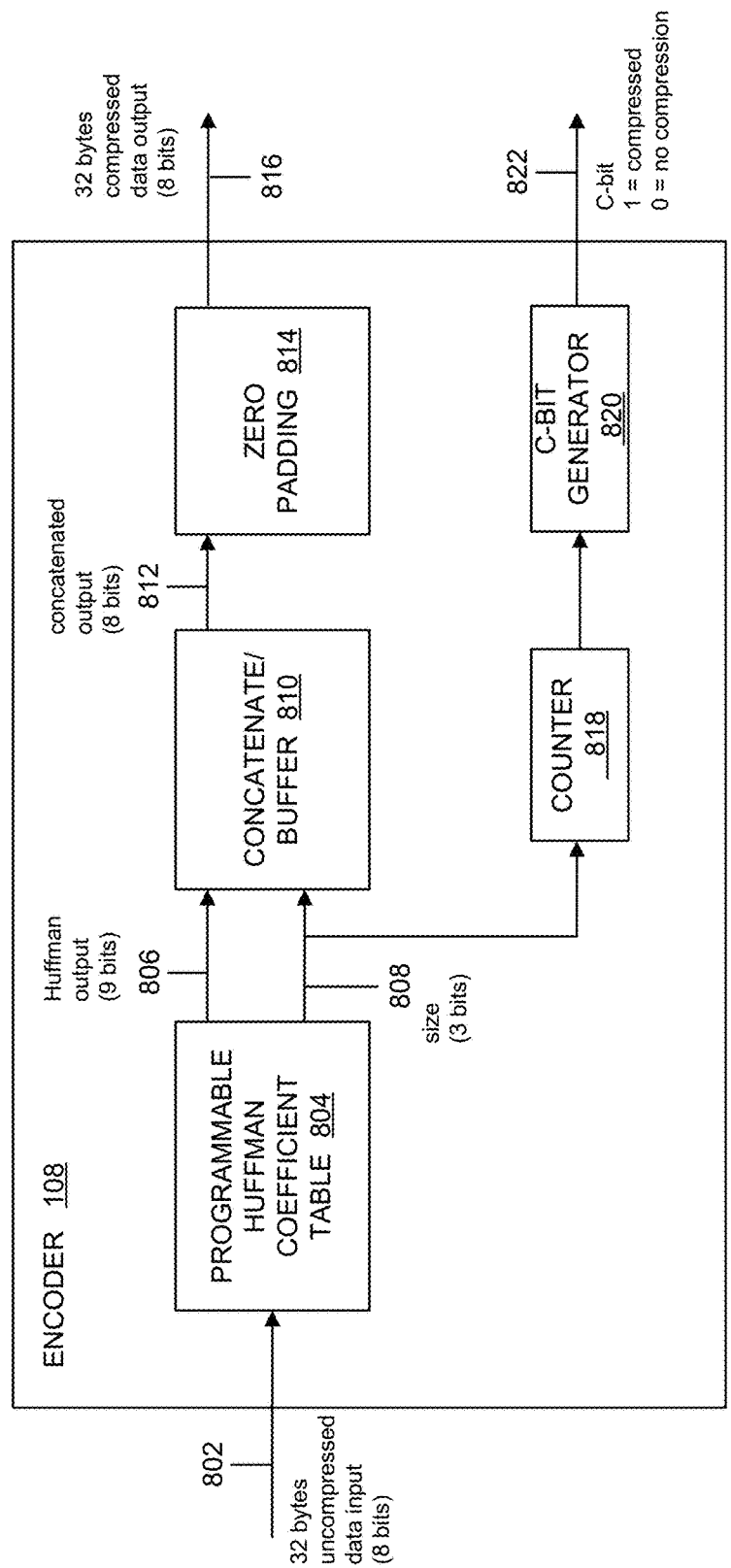
FIG. 8 is a block diagram illustrating an embodiment of the encoder in the SoC of FIG. 1.
Figure 9:
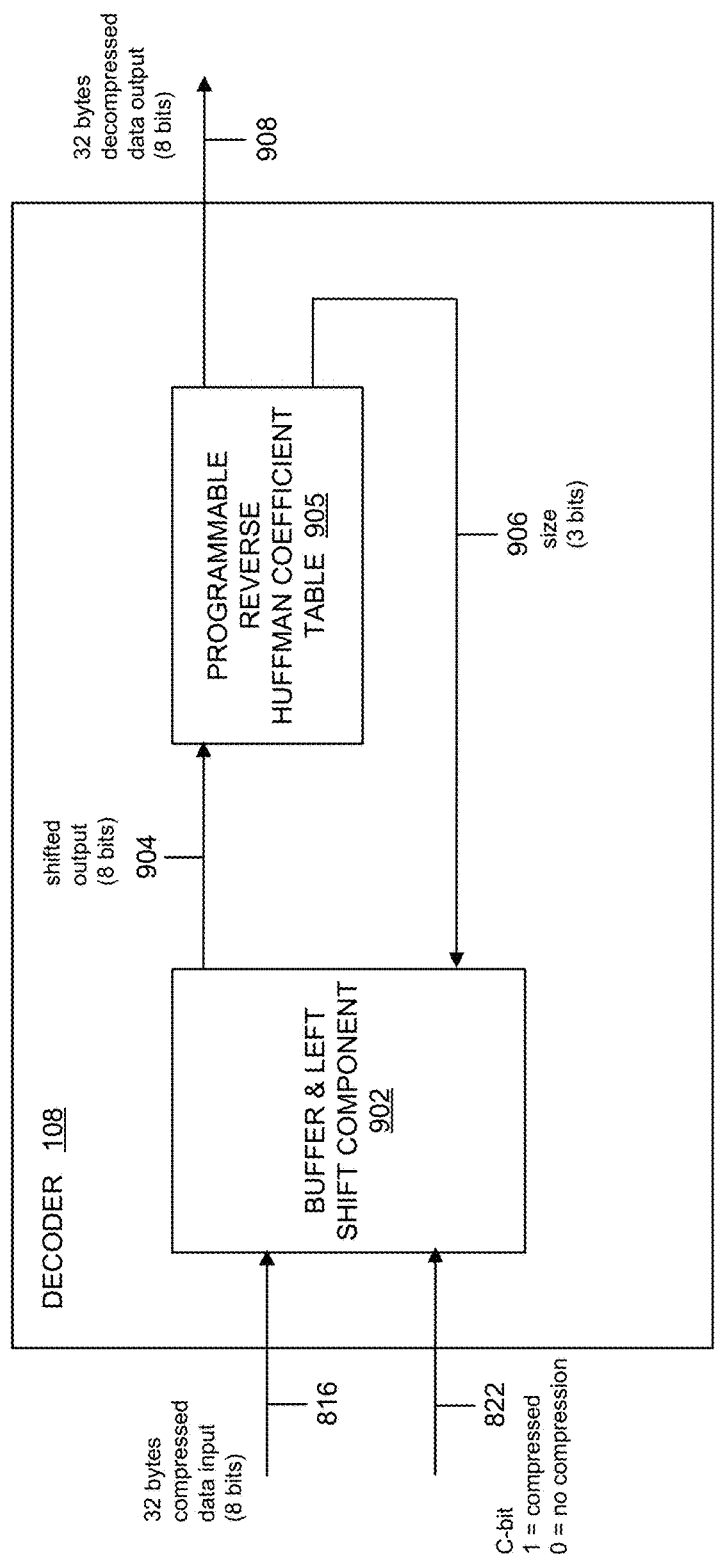
FIG. 9 is a block diagram illustrating an embodiment of the decoder in the DRAM memory system of FIG. 1.

FIGS. 8 & 9 illustrate an embodiment of the encoder 108 and the decoder 122, respectively. The encoder 108 may comprise a programmable Huffman coefficient table 804, a concatenate/buffer 810, a zero padding component 814, a counter 818, and a C-bit generator 820. The encoder 108 receives uncompressed data input on connection 802. In this example, the uncompressed data comprises 32 bytes (8 bits), as described above. The table 804 comprises programmable encoder coefficients that may be used to implement, for example, the Huffman tree 500 (FIG. 5). The encoder coefficients may be loaded from the CPU, for example, during restart. The CPU may execute uncompressed code residing in ROM or a secondary loader. The Huffman output (9 bits) is provided on a connection 806 to a concatenate/buffer 810, which provides concatenated output (8 bits) to a zero padding component 814 via a connection 812. The zero padding component 814 provides the compressed output (8 bits) to a connection 816 to the decoder 122 (FIG. 9).

Figure 10:
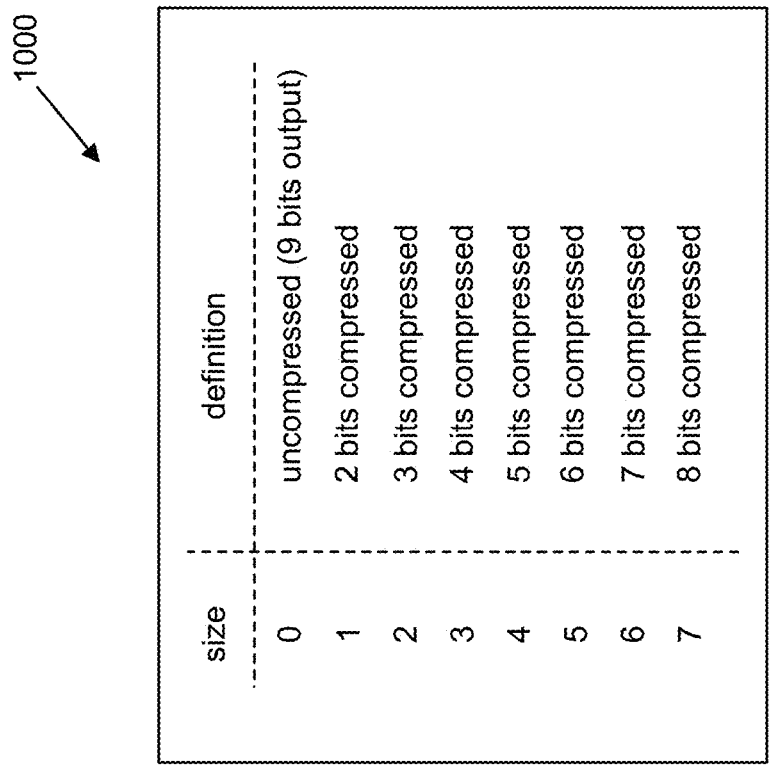
FIG. 10 is a table illustrating exemplary values for the 3-bit size output in the encoder of FIG. 8.

A size (3 bits) is provided to a counter 818 via a connection 808. FIG. 10 is a table 1000 illustrating the 3-bit representations (values 0-7) and their respective definitions. C-bit generator 820 may be configured to determine when a predetermined byte size is reached. C-bit generator 820 generates and provides the C-bit, via connection 822, to identify whether the data input on connection 816 has been compressed or not. As mentioned above, if the compression results in a larger size, the C-bit may be set to a C=0, indicating that the raw data input is output because it is smaller than the compressed data (e.g., compressed size>uncompressed size).

Referring to FIG. 9, the compressed data and the C-bit may be received by a buffer & left shift component 902 via connections 816 and 822, respectively. Shifted output (8 bits) may be provided, via a connection 904, to a programmable reverse Huffman coefficient table 905, which comprises the reverse coefficients loaded by the CPU. The decompressed data output may be provided, via a connection 908, to the core memory array 124.

Figure 12:
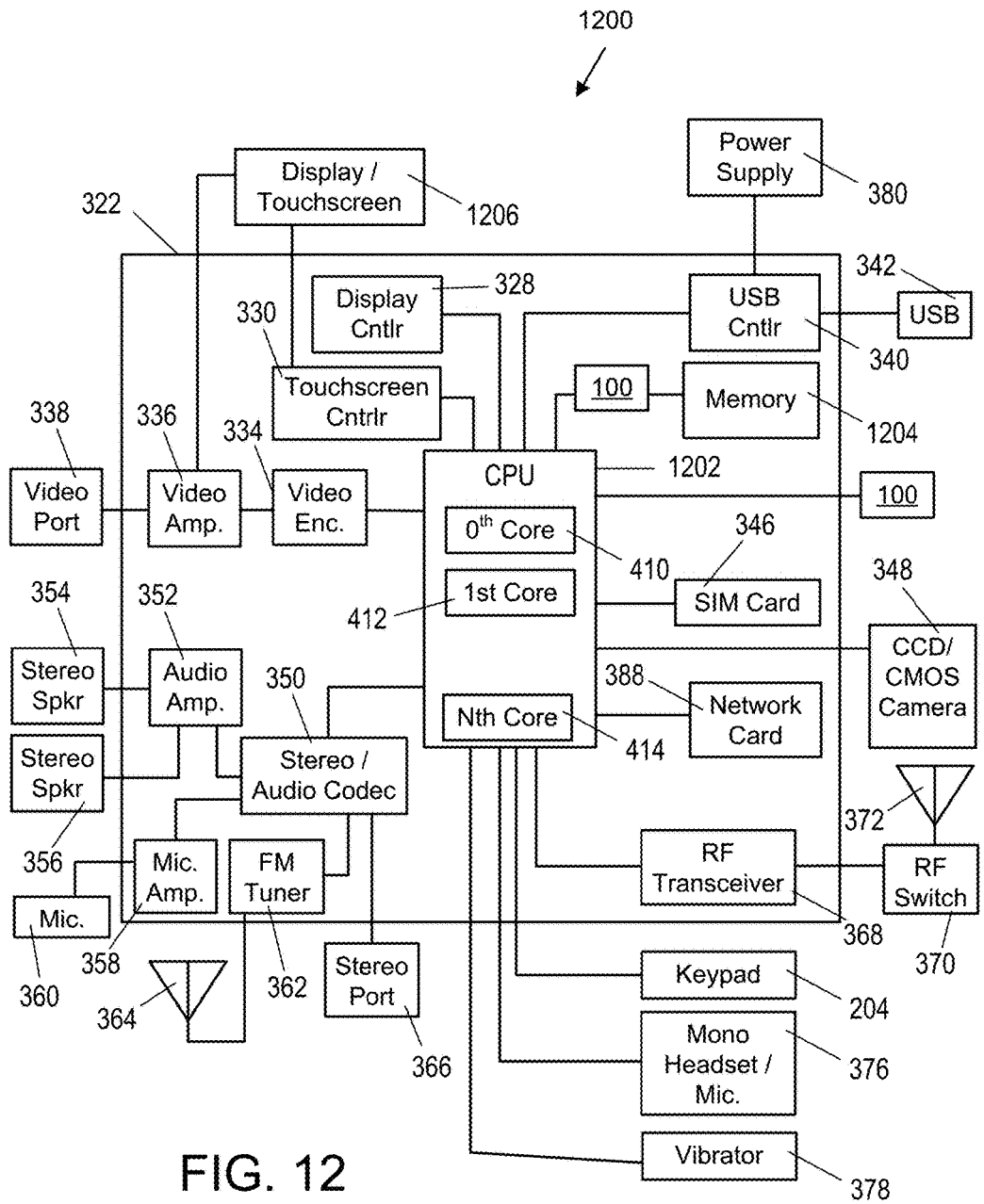
FIG. 12 is a block diagram of an embodiment of a portable computer device comprising the system of FIG. 1.

As mentioned above, the system 100 may be incorporated into any desirable computing system. FIG. 12 illustrates the system 100 incorporated in an exemplary portable computing device (PCD) 1200. It will be readily appreciated that certain components of the system 100 (e.g., the encoder 108) are included on the SoC 322 (FIG. 12) while other components (e.g., the DRAM memory system 104) are external components coupled to the SoC 322. The SoC 322 may include a multicore CPU 402A. The multicore CPU 1202 may include a zeroth core 410, a first core 412, and an Nth core 414. One of the cores may comprise, for example, a graphics processing unit (GPU) with one or more of the others comprising the CPU.

A display controller 328 and a touch screen controller 330 may be coupled to the CPU 1202. In turn, the touch screen display 108 external to the on-chip system 322 may be coupled to the display controller 1206 and the touch screen controller 330.

FIG. 12 further shows that a video encoder 334, e.g., a phase alternating line (PAL) encoder, a sequential color a memoire (SECAM) encoder, or a national television system(s) committee (NTSC) encoder, is coupled to the multicore CPU 1202. Further, a video amplifier 336 is coupled to the video encoder 334 and the touch screen display 1206. Also, a video port 338 is coupled to the video amplifier 336. As shown in FIG. 12, a universal serial bus (USB) controller 340 is coupled to the multicore CPU 1202. Also, a USB port 342 is coupled to the USB controller 340. Memory 1204 and a subscriber identity module (SIM) card 346 may also be coupled to the multicore CPU 1202. Memory 1204 may reside on the SoC 322 or be coupled to the SoC 322 (as illustrated in FIG. 1). The memory 1204 may comprise DRAM memory system 104 (FIG. 1) as described above.

Further, as shown in FIG. 12, a digital camera 348 may be coupled to the multicore CPU 1202. In an exemplary aspect, the digital camera 348 is a charge-coupled device (CCD) camera or a complementary metal-oxide semiconductor (CMOS) camera.

As further illustrated in FIG. 12, a stereo audio coder-decoder (CODEC) 350 may be coupled to the multicore CPU 1202. Moreover, an audio amplifier 352 may coupled to the stereo audio CODEC 350. In an exemplary aspect, a first stereo speaker 354 and a second stereo speaker 356 are coupled to the audio amplifier 352. FIG. 12 shows that a microphone amplifier 358 may be also coupled to the stereo audio CODEC 350. Additionally, a microphone 360 may be coupled to the microphone amplifier 358. In a particular aspect, a frequency modulation (FM) radio tuner 362 may be coupled to the stereo audio CODEC 350. Also, an FM antenna 364 is coupled to the FM radio tuner 362. Further, stereo headphones 366 may be coupled to the stereo audio CODEC 350.

FIG. 12 further illustrates that a radio frequency (RF) transceiver 368 may be coupled to the multicore CPU 402A. An RF switch 370 may be coupled to the RF transceiver 368 and an RF antenna 372. As shown in FIG. 12, a keypad 204 may be coupled to the multicore CPU 1202. Also, a mono headset with a microphone 376 may be coupled to the multicore CPU 1202. Further, a vibrator device 378 may be coupled to the multicore CPU 1202.

FIG. 12 also shows that a power supply 380 may be coupled to the on-chip system 322. In a particular aspect, the power supply 380 is a direct current (DC) power supply that provides power to the various components of the PCD 1200 that require power. Further, in a particular aspect, the power supply is a rechargeable DC battery or a DC power supply that is derived from an alternating current (AC) to DC transformer that is connected to an AC power source.

FIG. 12 further indicates that the PCD 1200 may also include a network card 388 that may be used to access a data network, e.g., a local area network, a personal area network, or any other network. The network card 388 may be a Bluetooth network card, a WiFi network card, a personal area network (PAN) card, a personal area network ultra-low-power technology (PeANUT) network card, a television/cable/satellite tuner, or any other network card well known in the art. Further, the network card 388 may be incorporated into a chip, i.e., the network card 388 may be a full solution in a chip, and may not be a separate network card 388.

As depicted in FIG. 12, the touch screen display 1206, the video port 338, the USB port 342, the camera 348, the first stereo speaker 354, the second stereo speaker 356, the microphone 360, the FM antenna 364, the stereo headphones 366, the RF switch 370, the RF antenna 372, the keypad 374, the mono headset 376, the vibrator 378, and the power supply 380 may be external to the on-chip system 322.

It should be appreciated that one or more of the method steps described herein may be stored in the memory as computer program instructions, such as the modules described above. These instructions may be executed by any suitable processor in combination or in concert with the corresponding module to perform the methods described herein.

Figure 13:
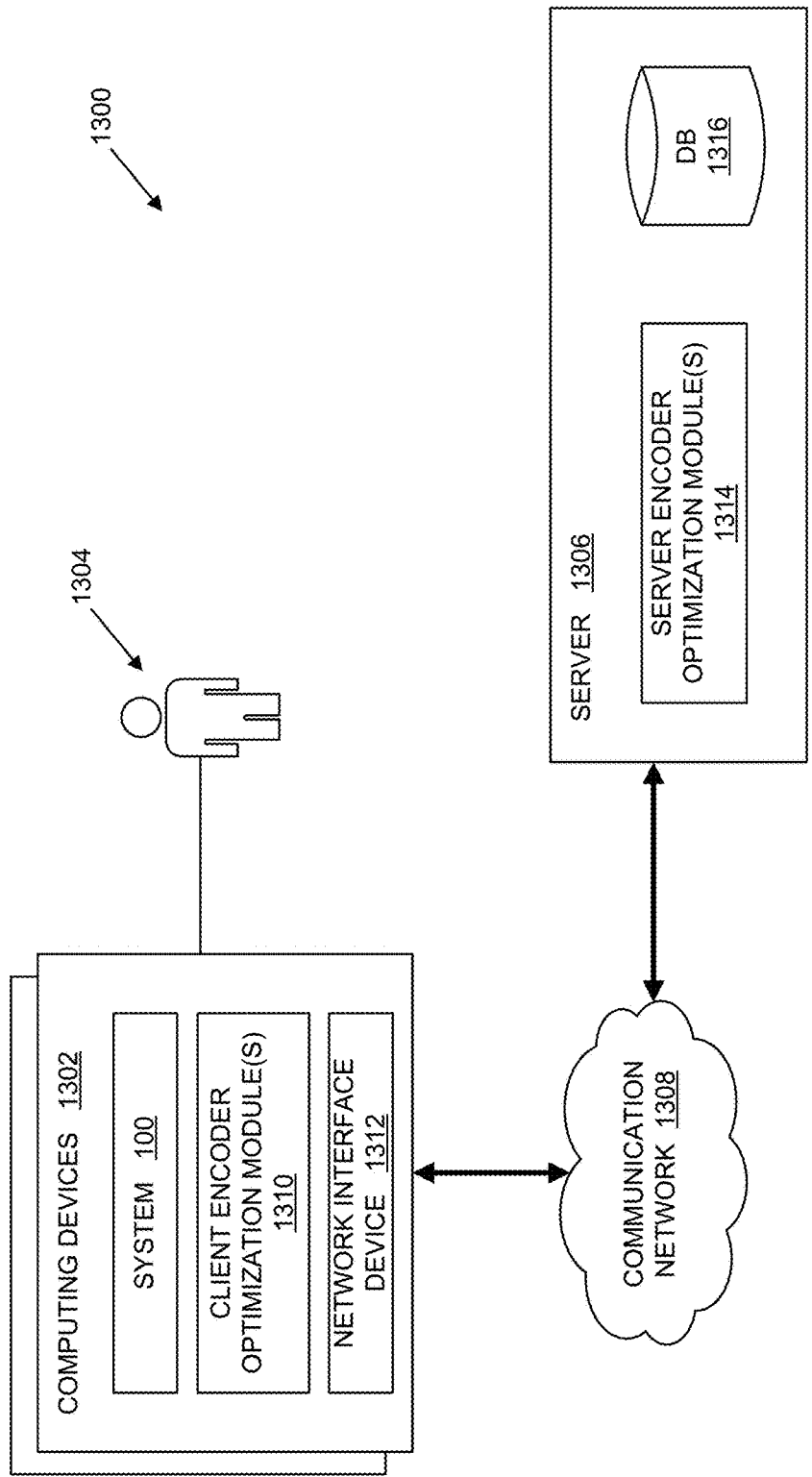
FIG. 13 is a block diagram of an embodiment of a system for optimizing the encoder compression performance of a plurality of users.

As mentioned above, the compression schemes implemented by the system 100 may be optimized by a cloud-based server. FIG. 13 illustrates an embodiment of a computer system 1300 for optimizing the compression algorithms (e.g., code tables, compression coefficients, etc.) implemented in a system 100 incorporated in a plurality of computing devices 1302. The computer system 1300 comprises a server 1306 in communication with a plurality of computing devices 1302 via a communications network 1308. Each computing device 1302 may be operated by a corresponding user 1304. The communication network 1308 may support wired and/or wireless communication via any suitable protocols, including, for example, the Internet, the Public Switched Telephone Network (PSTN), wide area network(s), local area networks, wireless access points, or any other suitable communication infrastructure.

The computing devices 1302 may comprise a personal computer, laptop, notebook, video game console, portable computing device, mobile phone, etc. As illustrated in FIG. 13, the computing devices 1302 include a system 100, as described above, for conserving power consumption in a memory system by encoding memory data according to a compression scheme. The server 1306 communicates with each of the computing devices 1302 via the communication network 1308.

In general, the computer system 1300 comprises encoder optimization module(s), which comprise the logic and/or functionality for generating and optimizing the codebooks provided to the computing devices 1302 and implemented by the corresponding encoders 108. It should be appreciated that certain aspects of the encoder optimization module(s) may be located at the computing devices 1302 while other aspects may be located at the server 1306. Client-side functions may be provided by client encoder optimization module(s) 1310 and server-side functions may be provided by server encoder optimization module(s) 1314. In an embodiment, the client encoder optimization module(s) 1310 may comprise a mobile application that provides data communications and synchronization with the server 1314 and user interface features and controls. For example, users 1304 may selectively enable and disable codebook optimization. As described below in more detail, the client encoder optimization module(s) 1310 may control transmission of codebook optimization data to the server 1306 (e.g., compression statistics and various device and/or user metrics). In general, the server encoder optimization module(s) 1306 comprise the logic and/or functionality for receiving codebook optimization data from the computing devices 1302, generating and providing codebooks to each computing device 1302, and optimizing the codebooks across a network of multiple users 1304 via a database 1316.

Figure 14:
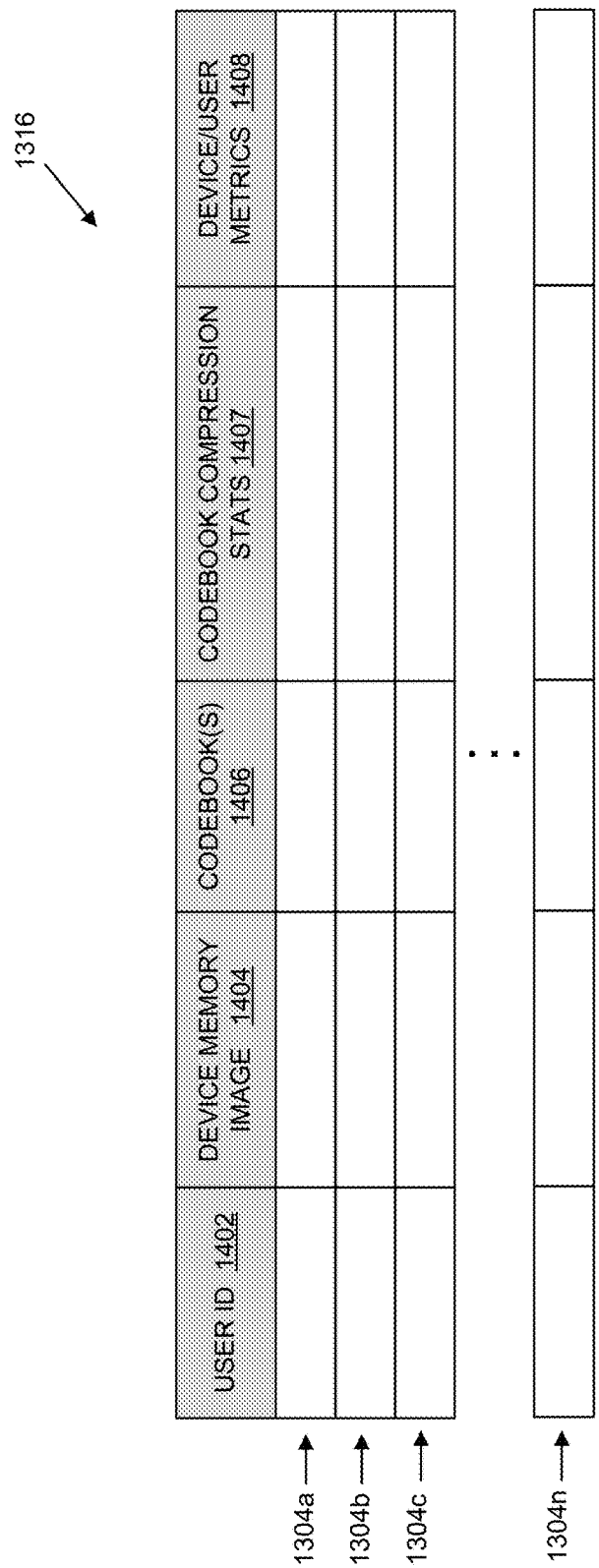
FIG. 14 is a data diagram illustrating an embodiment of the server database generated by the encoder optimization modules in the system of FIG. 13.

FIG. 14 illustrates an embodiment of the server database 1316. The server database 1316 stores various types of data for each user 1304 in the computer system 1302 with one or more of the following information associated with the user 1304 and/or the corresponding computing device 1302: a device memory image 1404, codebook(s) 1406 provided to the computing device 1302, and codebook compression statistics 1407 and device/user metrics 1408 received from the computing device 1302. Each row in the database 1316 corresponds to the data associated with a different user 1304 in the computer system 1300. The first row corresponds to a user 1304*a*. The second row corresponds to a user 1304*b*. The third row corresponds to a user 1304*c*. The final row corresponds to a user 1304*n*. It should be appreciated that any number of rows may be stored to accommodate any number of users.

Figure 15:
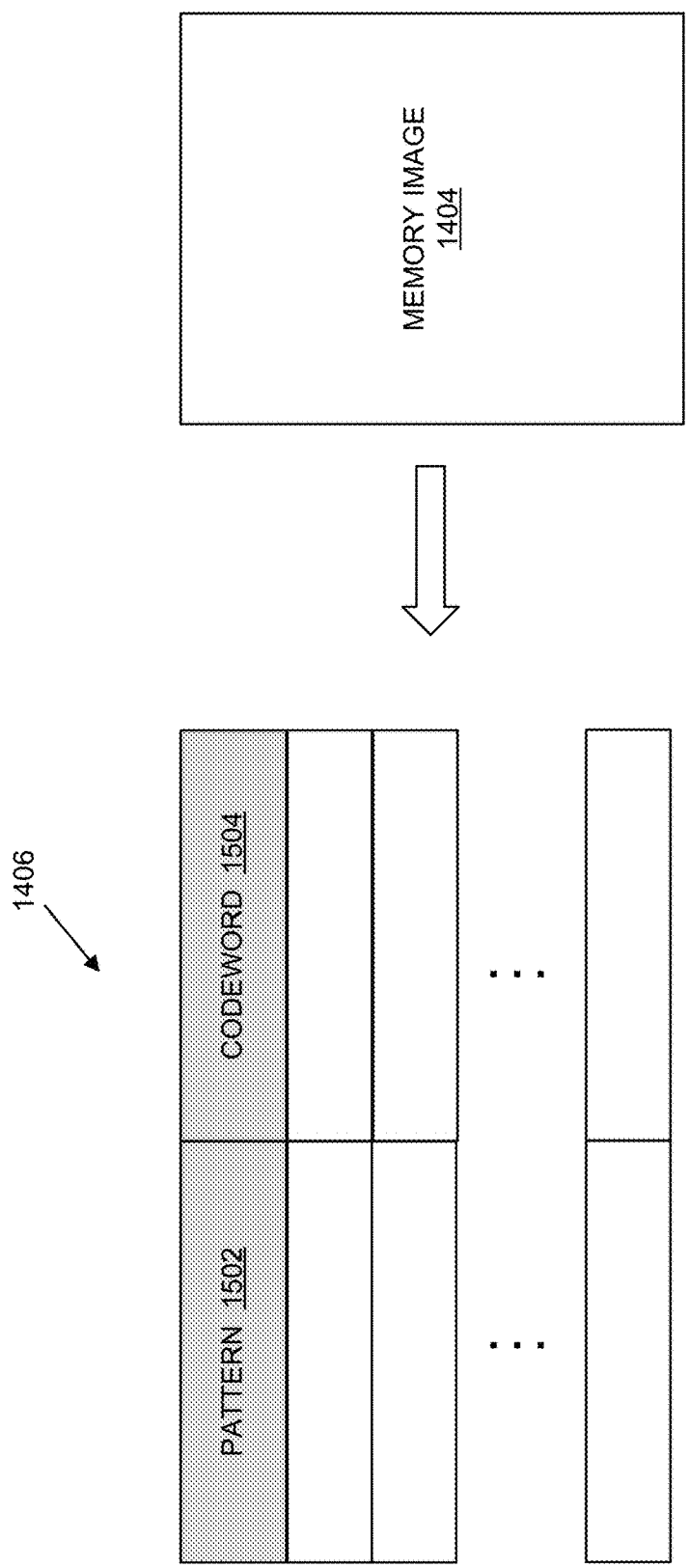
FIG. 15 illustrates an embodiment of an exemplary codebook associated with a memory image of a computing device.
Figure 16:
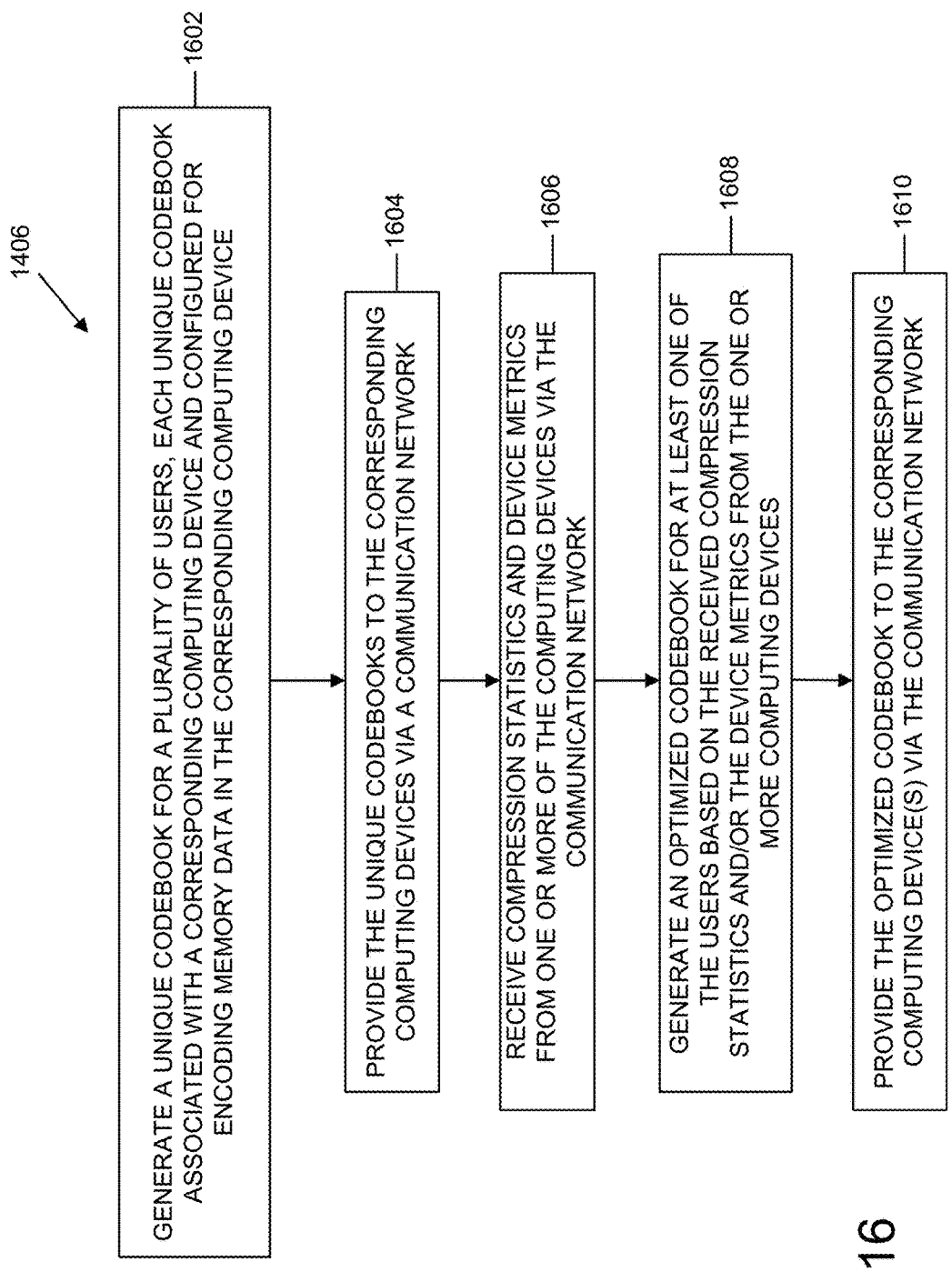
FIG. 16 is a flow chart illustrating the architecture, operation, and/or functionality of an embodiment of the server encoder optimization module in the system of FIG. 13.

FIG. 16 illustrates the architecture, operation, and/or functionality of an embodiment of the server encoder optimization module(s) 1306. At block 1602, a unique codebook may be generated for each user 1304 in the computer system 1300. Each codebook is associated with one of the computing devices 1302 and, as described above, is configured for encoding the memory data in the corresponding computing device 1302 according to a compression scheme. The compression scheme may comprise an entropy-based encoding algorithm, such as, the Huffman encoding scheme illustrated in FIG. 5. As illustrated in FIG. 15, a codebook 1406 comprises a code table identifying the most frequent symbols or "patterns" to be compressed with each pattern being assigned a corresponding codeword 1504.

The initial codebook 1406 for a computing device 1302 may be generated by building a virtual memory image 1404 of the computing device 1302. The server 1306 may receive various types of information (e.g., information 1700—FIG. 17) for various software components (e.g., applications, application frameworks, services/runtime environments, libraries, kernel, operating systems, etc.). The server 1306 may decompress applications and other pre-compressed structures and build the virtual memory image 1404.

It should be appreciated that a codebook 1406 may be generated in various ways. In one embodiment, the server 1306 employs a phased codebook generation process. A first phase involves generating a first order static codebook based on a static distribution of patterns within each software component. The server 1306 may search through each component in the virtual memory image 1404 for the most repetitive code patterns 1502 and assign these the shortest codewords 1504. Frequently running processes may also be assigned the shortest codewords 1504. A second phase may involve dynamic codebook generation and validation. The virtual memory image 1404 may be loaded and scripted/executed on a virtual device running on the server 1306. Memory transactions may be logged and the read/write traffic recorded. A similar pattern search may be performed based on dynamic instead of static distribution patterns.

Referring again to FIG. 16, at block 1604, the server 1306 provides the unique codebooks 1406 to the corresponding computing devices 1302 via the communication network 1308. A computing device 1302 may receive the codebook 1406 and begin using the codebook 1406 for compressing memory data, as described above. At block 1606, the server 1306 may receive compression statistics and/or device metrics from the computing devices 1302. The compression statistics may comprise, for example, C-bit statistics as illustrated in FIG. 11.

Figure 17:
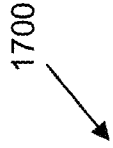
FIG. 17 is a table illustrating various exemplary device metrics used for generating an optimized codebook for one or more users in the system of FIG. 13.

FIG. 17 illustrates various examples of information 1700, such as, for example, device metrics 1702 and values 1704, 1706, and 1708 that may be useful in optimizing the codebooks 1406. The compression statistics and device metrics may be stored in the database 1316. A first device metric 1702 may comprise a process identifier (Process_IDx) that identifies a particular process or task requesting memory resources, and which may comprise values for a timestamp, an average time the process or task runs (% avg_time_running), and version information associated with the process or task. A second device metric 1702 may comprises a hardware identifier (Phone_Hardware_ID), which may comprise values for identifying hardware models (Hardware_model) and any phone revisions (Phone_revision). A third device metric 1702 may comprise CPU utilization with values for tracking timestamp(s) and average CPU utilization. A fourth device metric 1702 may include compression statistics for specific clients identified according to the master ID 1104 (FIG. 11). A fifth device metric 1702 may comprise a software identifier (Phone_Software_ID), which may comprise values for identifying version information.

It should be appreciated that multiple processes may be running concurrently and that numerous additional metrics associated with the computing devices 1302 may be received. In an embodiment, metrics such as phone hardware ID and phone software ID may be used to separately cross-reference and obtain the default factory software locally from a database 1316 to create a default virtual memory image 1404, and metrics such as process ID and version may be used to separately cross-reference and obtain locally from a database 1316 any additional software that has been installed by the user 1304 and then revising the factory virtual memory image 1404 to create the user-specific virtual memory image 1404. In an embodiment, this can be done with greatly reduced communication network 1308 bandwidth because the actual image 1404 on the user's 1304 computing device 1302 is not sent directly to the server 1306. The local database 1316 may be periodically updated with new software components.

At block 1608, the server 1306 may process the compression statistics and/or the device metrics from each of the users 1304 in the computer system 1304 and generate an optimized codebook 1406 for one or more of the computing devices 1302. In an embodiment, the server 1306 may look across all users 1304 with similar device metrics and for C-bit statistics with a maximum percentage of successful compression, which may translate to improved power savings. At block 1610, the optimized codebook 1406 may be provided to one or more of the computing devices 1302.

Certain steps in the processes or process flows described in this specification naturally precede others for the invention to function as described. However, the invention is not limited to the order of the steps described if such order or sequence does not alter the functionality of the invention. That is, it is recognized that some steps may performed before, after, or parallel (substantially simultaneously with) other steps without departing from the scope and spirit of the invention. In some instances, certain steps may be omitted or not performed without departing from the invention. Further, words such as "thereafter", "then", "next", etc. are not intended to limit the order of the steps. These words are simply used to guide the reader through the description of the exemplary method.

Additionally, one of ordinary skill in programming is able to write computer code or identify appropriate hardware and/or circuits to implement the disclosed invention without difficulty based on the flow charts and associated description in this specification, for example.

Therefore, disclosure of a particular set of program code instructions or detailed hardware devices is not considered necessary for an adequate understanding of how to make and use the invention. The inventive functionality of the claimed computer implemented processes is explained in more detail in the above description and in conjunction with the Figures which may illustrate various process flows.

In one or more exemplary aspects, the functions described may be implemented in hardware, software, firmware, or any combination thereof. If implemented in software, the functions may be stored on or transmitted as one or more instructions or code on a computer-readable medium. Computer-readable media include both computer storage media and communication media including any medium that facilitates transfer of a computer program from one place to another. A storage media may be any available media that may be accessed by a computer. By way of example, and not limitation, such computer-readable media may comprise RAM, ROM, EEPROM, NAND flash, NOR flash, M-RAM, P-RAM, R-RAM, CD-ROM or other optical disk storage, magnetic disk storage or other magnetic storage devices, or any other medium that may be used to carry or store desired program code in the form of instructions or data structures and that may be accessed by a computer.

Also, any connection is properly termed a computer-readable medium. For example, if the software is transmitted from a website, server, or other remote source using a coaxial cable, fiber optic cable, twisted pair, digital subscriber line ("DSL"), or wireless technologies such as infrared, radio, and microwave, then the coaxial cable, fiber optic cable, twisted pair, DSL, or wireless technologies such as infrared, radio, and microwave are included in the definition of medium.

Disk and disc, as used herein, includes compact disc ("CD"), laser disc, optical disc, digital versatile disc ("DVD"), floppy disk and blu-ray disc where disks usually reproduce data magnetically, while discs reproduce data optically with lasers. Combinations of the above should also be included within the scope of computer-readable media.

Alternative embodiments will become apparent to one of ordinary skill in the art to which the invention pertains without departing from its spirit and scope. Therefore, although selected aspects have been illustrated and described in detail, it will be understood that various substitutions and alterations may be made therein without departing from the spirit and scope of the present invention, as defined by the following claims.

What is claimed is:

1. A method for reducing non-core power consumption of dynamic random access memory (DRAM) memory, the method comprising:
    receiving memory data from one or more memory clients residing on a system on chip (SoC) for accessing a dynamic random access memory (DRAM) memory system coupled to the SoC;
    reducing a data activity factor defined by the received memory data by encoding the received memory data with an encoder having a compression scheme that comprises an entropy encoding algorithm to reduce the number of bit transitions prior to storing the memory data into the DRAM memory system, the encoder residing on the SoC and comprising a programmable codebook module having codewords based on the entropy encoding algorithm for matching data on a per byte basis;
    providing the encoded memory data over a bus to the DRAM memory system, wherein the DRAM memory system comprises a decoder for decoding the encoded memory data;
    the DRAM memory system decoding the encoded memory data according to the compression scheme into the received memory data after the encoded memory data is received into the DRAM memory system; and
    the DRAM memory system storing the memory data in decoded form into a memory component of the DRAM, wherein the reduction of the data activity from the encoder having the compression scheme that comprises the entropy encoding algorithm reduces non-core power consumption of the memory system.

2. The method of claim 1, wherein the encoding the received memory data with the encoder having the compression scheme, further comprises: for each minimum access length (MAL) transaction defined by the DRAM memory system, determining whether bit patterns associated with a predefined byte size of the received memory data matches one of a plurality of predefined code words associated with the compression scheme.

3. The method of claim 2, wherein: if the bit pattern matches one of the predefined code words, encoding the bit pattern with the matching predefined code word.

4. The method of claim 2, wherein the encoding the received memory data further comprises: zero padding the encoded memory data based on a size of the MAL transaction defined by the DRAM memory system.

5. The method of claim 1, wherein the encoding the received memory data further comprises: generating a compression bit identifying that the encoded memory data for a minimum access length (MAL) transaction has been compressed.

6. The method of claim 5, further comprising: a concatenate buffer module concatenating the compression bit with the encoded memory data for the MAL transaction.

7. A system for reducing power non-core consumption of dynamic random access memory (DRAM) memory, the system comprising:
    means for receiving memory data from one or more memory clients residing on a system on chip (SoC) for accessing a dynamic random access memory (DRAM) memory system coupled to the SoC;
    an encoder for reducing a data activity factor defined by the received memory data by encoding the received memory data according to a compression scheme that comprises an entropy encoding algorithm to reduce the number of bit transitions prior to storing the memory data into the DRAM memory system, the encoder residing on the SoC and comprising a programmable codebook module having codewords based on the entropy encoding algorithm for matching data on a per byte basis;
    means for providing the encoded memory data over a bus to the DRAM memory system, wherein the DRAM memory system comprises a decoder for decoding the encoded memory data;
    means for decoding the encoded memory data according to the compression scheme into the received memory data after the encoded memory data is received into the DRAM memory system; and
    the DRAM memory system storing the memory data in decoded form into a memory component of the DRAM, wherein the reduction of the data activity from the encoder having the compression scheme that comprises the entropy encoding algorithm reduces non-core power consumption of the memory system.

8. The system of claim 7, wherein the encoder further comprises: means for determining, for each minimum access length (MAL) transaction defined by the DRAM memory system, whether bit patterns associated with a predefined byte size of the received memory data matches one of a plurality of predefined code words associated with the compression scheme.

9. The system of claim 8, wherein: if the bit pattern matches one of the predefined code words, encoding the bit pattern with the matching predefined code word.

10. The system of claim 8, wherein the means for encoding the received memory data further comprises: zero padding the encoded memory data based on a size of the MAL transaction defined by the DRAM memory system.

11. The system of claim 7, wherein the means for encoding the received memory data further comprises: generating a compression bit identifying that the encoded memory data for a minimum access length (MAL) transaction has been compressed.

12. The system of claim 11, wherein a concatenate buffer concatenates the compression bit with the encoded memory data for the MAL transaction.

13. A computer program product comprising a computer usable non-transitory tangible medium having a computer readable program code embodied therein, the computer readable program code adapted to be executed to implement a method for reducing non-core power consumption of dynamic random access memory (DRAM) memory, the method comprising:
 receiving memory data from one or more memory clients residing on a system on chip (SoC) for accessing a dynamic random access memory (DRAM) memory system coupled to the SoC;
 reducing a data activity factor defined by the received memory data by encoding the received memory data with an encoder according to having a compression scheme that comprises an entropy encoding algorithm to reduce the number of bit transitions prior to storing the memory data into the DRAM memory system, the encoder residing on the SoC and comprising a programmable codebook module having codewords based on the entropy encoding algorithm for matching data on a per byte basis;
 providing the encoded memory data over a bus to the DRAM memory system, wherein the DRAM memory system comprises a decoder for decoding the encoded memory data;
 the DRAM memory system decoding the encoded memory data according to the compression scheme into the received memory data after the encoded memory data is received into the DRAM memory system; and
 the DRAM memory system storing the memory data in decoded form into a memory component of the DRAM, wherein the reduction of the data activity from the encoder having the compression scheme that comprises the entropy encoding algorithm reduces non-core power consumption of the memory system.

14. The computer program product of claim 13, wherein the encoding the received memory data with the encoder having the compression scheme, further comprises: for each minimum access length (MAL) transaction defined by the DRAM memory system, determining whether bit patterns associated with a predefined byte size of the received memory data matches one of a plurality of predefined code words associated with the compression scheme.

15. The computer program product of claim 14, wherein: if the bit pattern matches one of the predefined code words, encoding the bit pattern with the matching predefined code word.

16. The computer program product of claim 14, wherein the encoding the received memory data further comprises: zero padding the encoded memory data based on a size of the MAL transaction defined by the DRAM memory system.

17. The computer program product of claim 13, wherein the encoding the received memory data further comprises: generating a compression bit identifying that the encoded memory data for a minimum access length (MAL) transaction has been compressed.

18. The computer program product of claim 17, wherein the concatenate buffer module concatenates the compression bit with the encoded memory data for the MAL transaction.

19. The computer program product of claim 17, further comprising: providing the compression bit to the DRAM memory system separate from the encoded memory data.

20. A system for reducing non-core power consumption of dynamic random access memory (DRAM) memory, the system comprising:
 a system on chip (SoC) comprising one or more memory clients for accessing a dynamic random access memory (DRAM) memory system coupled to the SoC;
 an encoder residing on the SoC and configured to reduce a data activity factor of memory data received from the memory clients by encoding the received memory data according to a compression scheme that comprises an entropy encoding algorithm to reduce the number of bit transitions prior to storing the memory data into the DRAM memory system and providing the encoded memory data to the DRAM memory system, the encoder comprising a programmable codebook module having codewords based on the entropy encoding algorithm for matching data on a per byte basis;
 the DRAM memory system comprising a decoder configured to decode the encoded memory data according to the compression scheme into the received memory data after the encoded memory data is received over a bus into the DRAM memory system; and
 the DRAM memory system storing the memory data in decoded form into a memory component of the DRAM, wherein the reduction of the data activity from the encoder having the compression scheme that comprises the entropy encoding algorithm reduces non-core power consumption of the memory system.

21. The system of claim 20, wherein the encoder is configured to determine, for each minimum access length (MAL) transaction defined by the DRAM memory system, whether bit patterns associated with a predefined byte size of the received memory data matches one of a plurality of predefined code words associated with the compression scheme.

22. The system of claim 21, wherein if the bit pattern matches one of the predefined code words, encoding the bit pattern with the matching predefined code word.

23. The system of claim 21, wherein the encoder is further configured to zero pad the encoded memory data based on a size of the MAL transaction defined by the DRAM memory system.

24. The system of claim 20, wherein the encoder is further configured to generate a compression bit identifying that the encoded memory data for a minimum access length (MAL) transaction has been compressed.

25. The system of claim 24, wherein the concatenate buffer module is further configured to concatenate the compression bit with the encoded memory data for the MAL transaction.

26. The system of claim 24, wherein the compression bit is provided to the DRAM memory system separately from the encoded memory data.

* * * * *